(12) United States Patent
Kotani et al.

(10) Patent No.: US 10,361,184 B2
(45) Date of Patent: Jul. 23, 2019

(54) SEMICONDUCTOR DEVICE

(71) Applicant: SHINDENGEN ELECTRIC MANUFACTURING CO., LTD., Tokyo (JP)

(72) Inventors: Ryohei Kotani, Hanno (JP); Toshiki Matsubara, Hanno (JP); Nobutaka Ishizuka, Hanno (JP); Masato Mikawa, Hanno (JP); Hiroshi Oshino, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/543,792

(22) PCT Filed: Sep. 30, 2016

(86) PCT No.: PCT/JP2016/078998
§ 371 (c)(1),
(2) Date: Apr. 5, 2018

(87) PCT Pub. No.: WO2018/061177
PCT Pub. Date: Apr. 5, 2018

(65) Prior Publication Data
US 2018/0331092 A1    Nov. 15, 2018

(51) Int. Cl.
*H01L 27/02* (2006.01)
*H01L 29/06* (2006.01)
(Continued)

(52) U.S. Cl.
CPC ........ *H01L 27/0255* (2013.01); *H01L 23/528* (2013.01); *H01L 29/0615* (2013.01);
(Continued)

(58) Field of Classification Search
None
See application file for complete search history.

(56) References Cited

U.S. PATENT DOCUMENTS 9,406,666 B2 *  8/2016  Naito .................... H01L 29/405
2003/0107102 A1  6/2003  Ozeki et al.
(Continued)

FOREIGN PATENT DOCUMENTS

EP    0 566 179 A1    10/1993
JP    04-162681 A     6/1992
(Continued)

OTHER PUBLICATIONS

Dutch Search Report for Application No. 2019315, dated Jan. 11, 2018 (20 Pages).
(Continued)

*Primary Examiner* — Thien F Tran
(74) *Attorney, Agent, or Firm* — Nutter McClennen & Fish LLP

(57) ABSTRACT

A semiconductor device according to an embodiment includes: an insulating film formed on a voltage supporting region B; an overvoltage protection diode that includes an n-type semiconductor layer and a p-type semiconductor layer; conductor portions that are formed on the insulating film and are electrically connected to the overvoltage protection diode; and a high-potential portion arranged above the overvoltage protection diode via an insulating film. The p-type impurity concentration of the p-type semiconductor layer is lower than the n-type impurity concentration of the n-type semiconductor layer. In the reverse bias application state, the high-potential portion has a higher potential than a potential of the potential of the p-type semiconductor layer disposed directly under the high-potential portion.

15 Claims, 6 Drawing Sheets

(51) Int. Cl.
  *H01L 29/08*    (2006.01)
  *H01L 29/16*    (2006.01)
  *H01L 29/20*    (2006.01)
  *H01L 29/40*    (2006.01)
  *H01L 29/47*    (2006.01)
  *H01L 29/78*    (2006.01)
  *H01L 23/528*   (2006.01)
  *H01L 29/739*   (2006.01)
  *H01L 29/861*   (2006.01)
  *H01L 29/866*   (2006.01)
  *H01L 29/76*    (2006.01)
  *H01L 31/036*   (2006.01)
  *H01L 31/112*   (2006.01)

(52) U.S. Cl.
  CPC ...... *H01L 29/0638* (2013.01); *H01L 29/0649* (2013.01); *H01L 29/0692* (2013.01); *H01L 29/0696* (2013.01); *H01L 29/16* (2013.01); *H01L 29/404* (2013.01); *H01L 29/7391* (2013.01); *H01L 29/7395* (2013.01); *H01L 29/7808* (2013.01); *H01L 29/861* (2013.01); *H01L 29/866* (2013.01); *H01L 29/0834* (2013.01); *H01L 29/1608* (2013.01); *H01L 29/2003* (2013.01); *H01L 29/405* (2013.01); *H01L 29/47* (2013.01)

(56) References Cited

U.S. PATENT DOCUMENTS

| | | |
|---|---|---|
| 2005/0167694 A1 | 8/2005 | Takahashi |
| 2007/0080395 A1 | 4/2007 | Wahl et al. |
| 2012/0049187 A1 | 3/2012 | Haruyama et al. |

FOREIGN PATENT DOCUMENTS

| | | |
|---|---|---|
| JP | 04-262580 A | 9/1992 |
| JP | 06-069423 A | 3/1994 |
| JP | 2004-296819 A | 10/2004 |
| JP | 2005-217152 A | 8/2005 |
| JP | 2007-165424 A | 6/2007 |
| JP | 2009-111304 A | 5/2009 |

OTHER PUBLICATIONS

International Search Report for Application No. PCT/JP2016/078998, dated Dec. 20, 2016 (3 pages).

* cited by examiner

SEMICONDUCTOR DEVICE

The present application claims priority under 35 U.S.C. § 365 to PCT/JP2016/078998, filed on Sep. 30, 2016, the disclosure of which are incorporated herein by reference.

TECHNICAL FIELD

The present invention relates to a semiconductor device and, more specifically, to a semiconductor device that includes an overvoltage protection diode.

BACKGROUND ART

Conventionally, semiconductor devices having what is called a MOS (Metal-Oxide-Semiconductor) structure, such as IGBT (Insulated Gate Bipolar Transistor) and MOSFET (MOS Field Effect Transistor), have been known. Such MOS-type semiconductor devices use overvoltage protection diodes made up of series-connected Zener diodes as overvoltage protection measures. More specifically, in the overvoltage protection diodes, n-type semiconductor layers and p-type semiconductor layers are alternately arranged adjacent to each other (e.g., see Patent Literature 1). In the case of IGBT, overvoltage protection diodes are provided between a collector terminal and a gate terminal and a gate terminal and an emitter terminal.

As shown in FIG. 8, a p-type semiconductor layer 50b (and n-type semiconductor layer) of an overvoltage protection diode are arranged on an insulating film 140 formed on a semiconductor substrate 120, and is covered with an insulating film 150.

Typically, in an overvoltage protection diode, the p-type impurity concentration in a p-type semiconductor layer is lower than the n-type impurity concentration in an n-type semiconductor layer. Consequently, the breakdown voltage (Zener voltage) of an overvoltage protection diode is determined according to the position of a high concentration region (concentration peak) of p-type impurity concentration. In a conventional overvoltage protection diode, as shown in FIG. 8, the p-type impurity concentration is the maximum in a boundary region F10 between the p-type semiconductor layer 50b and the insulating film 150. That is, the p-type impurity concentration in the boundary region F10 is higher than the p-type impurity concentration in an inner region G10. Consequently, the overvoltage protection diode causes Zener breakdown in the boundary region F10.

CITATION LIST

Patent Literature

[Patent Literature 1] Japanese Patent Laid-Open No. 2009-111304

SUMMARY OF INVENTION

Technical Problem

Incidentally, in a process of manufacturing an MOS-type semiconductor device (heating step and the like), mobile ions, such as sodium, contained in the insulating film 150 and impurities, such as boron, may move to the p-type semiconductor layer 50b, and, on the contrary, impurities, such as boron, in the boundary region F10 of the p-type semiconductor layer 50b may move to the insulating film 150, in some cases. Such movement of mobile ions and impurities varies the potential of the boundary region F10 and varies the distribution of carrier concentrations in the p-type semiconductor layer 50b. Consequently, a state is achieved that is analogous to a state where the position of the high concentration region of the p-type impurity concentration is varied. As a result, the breakdown voltage of the overvoltage protection diode is largely varied. Conventionally, since it is difficult to control movement of mobile ions and impurities, it is difficult to stabilize the breakdown voltage of the overvoltage protection diode.

The present invention thus has an object to provide a semiconductor device that can reduce variation in the breakdown voltage of an overvoltage protection diode.

Solution to Problem

A semiconductor device according to the present invention is a semiconductor device with principal current flowing from one principal surface to another principal surface of a semiconductor substrate, wherein the one principal surface of the semiconductor substrate includes an active region, and a voltage supporting region that surrounds the active region and contains a peripheral portion of the semiconductor substrate, and the semiconductor device includes:
a first insulating film formed on the voltage supporting region;
an overvoltage protection diode that includes an n-type semiconductor layer and a p-type semiconductor layer that are alternately arranged on the first insulating film in a manner adjacent to each other;
a plurality of conductor portions that are formed on the first insulating film, and are electrically connected to the overvoltage protection diode;
a second insulating film that covers the overvoltage protection diode and the conductor portions; and
a high-potential portion provided above the overvoltage protection diode with the second insulating film intervening therebetween,
a p-type impurity concentration of the p-type semiconductor layer is lower than an n-type impurity concentration of the n-type semiconductor layer, and
the high-potential portion has a higher potential than a potential of the p-type semiconductor layer disposed immediately under the high-potential portion in a reverse bias application state.

In the semiconductor device,
in the reverse bias application state, a concentration of positive charges of the p-type semiconductor layer in a boundary region of the p-type semiconductor layer with the second insulating film may be lower than a concentration of positive charges in a region inner than the boundary region of the p-type semiconductor layer.

In the semiconductor device,
the high-potential portion may be formed on the second insulating film.

In the semiconductor device,
a plurality of the p-type semiconductor layers immediately under the high-potential portion may be included.

In the semiconductor device,
the high-potential portion may be electrically connected to the conductor portions via a conductive connector formed on the second insulating film.

In the semiconductor device,
the conductive connector may have one end electrically connected to the high-potential portion, and another end electrically connected to the conductor portions.

In the semiconductor device,
the high-potential portion may be disposed at a site nearer to a center than a site where the conductor portions to which the conductive connector is connected are connected to the overvoltage protection diode, and above the overvoltage protection diode.

In the semiconductor device,
the other end of the conductive connector may be electrically connected to the conductor portions via a contact layer provided through the second insulating film.

In the semiconductor device,
the contact layer may be provided in a connecting region that allows the conductor portions to be connected to the overvoltage protection diode.

In the semiconductor device,
the conductive connector may be disposed nearer in a plan view to the active region than the conductor portions electrically connected to the conductive connector.

In the semiconductor device,
the high-potential portion may have one end electrically connected to the conductor portions via a first conductive connector formed on the second insulating film, and another end electrically connected to the conductor portion via a second conductive connector formed on the second insulating film.

In the semiconductor device,
an upper conductor portion may be further included that is made of conductive material formed on the second insulating film, is electrically connected to the high-potential portion, and is arranged so as to be overlapped in a plan view with the conductor portions.

In the semiconductor device,
the p-type semiconductor layer and the n-type semiconductor layer may be made of polysilicon.

In the semiconductor device,
the first insulating film and/or the second insulating film may be made of silicon dioxide film.

In the semiconductor device,
the semiconductor substrate may be of a first conductive type,
the semiconductor device may further include:
a second conductive type diffusion layer that is selectively formed on one principal surface in the voltage supporting region, and surrounds the active region;
a first conductive type diffusion region formed in the diffusion layer;
an emitter electrode formed on the diffusion region;
a gate electrode formed on the overvoltage protection diode;
a second conductive type collector region formed on another principal surface of the semiconductor substrate; and
a collector electrode formed on the collector region.

In the semiconductor device,
the semiconductor substrate may be of a first conductive type,
the semiconductor device may further include:
a second conductive type diffusion layer that is selectively formed on one principal surface in the voltage supporting region, and surrounds the active region;
a first conductive type diffusion region formed in the diffusion layer;
an emitter electrode formed on the diffusion region;
a gate electrode formed on the overvoltage protection diode;
a first conductive type drain region formed on another principal surface of the semiconductor substrate; and
a collector electrode that is formed on the drain region, and forms a Schottky barrier together with the drain region.

In the semiconductor device,
the semiconductor substrate may be of a first conductive type, and
the semiconductor device may further include:
a second conductive type diffusion layer that is selectively formed on one principal surface in the voltage supporting region, and surrounds the active region;
a first conductive type diffusion region formed in the diffusion layer;
a source electrode formed on the diffusion region;
a gate electrode formed on the overvoltage protection diode;
a first conductive type drain region formed on another principal surface of the semiconductor substrate; and
a drain electrode formed on the drain region.

Advantageous Effects of Invention

The semiconductor device according to the present invention includes the high-potential portion that is provided above the overvoltage protection diode with intervention of the second insulating film that covers the overvoltage protection diode, and has a higher potential than a potential of the p-type semiconductor layer disposed immediately therebelow in the reverse bias application state. Consequently, in the reverse bias application state, positive charges in the p-type semiconductor layer of the overvoltage protection diode are away from the boundary between the p-type semiconductor layer and the second insulating film. That is, the positive charges in the p-type semiconductor layer move into the inner region of the p-type semiconductor layer.

As a result, the concentration of positive charges in the boundary region is lower than the concentration of positive charges in the center region. That is, the concentration peak of positive charges is in the inner region. Consequently, the overvoltage protection diode causes Zener breakdown in the inner region. Therefore, even when mobile ions or impurities move across the boundary region and the p-type semiconductor layer, variation in the breakdown voltage of the overvoltage protection diode can be reduced.

The present invention can therefore reduce variation in the breakdown voltage of an overvoltage protection diode.

DESCRIPTION OF EMBODIMENTS

Figure 1:
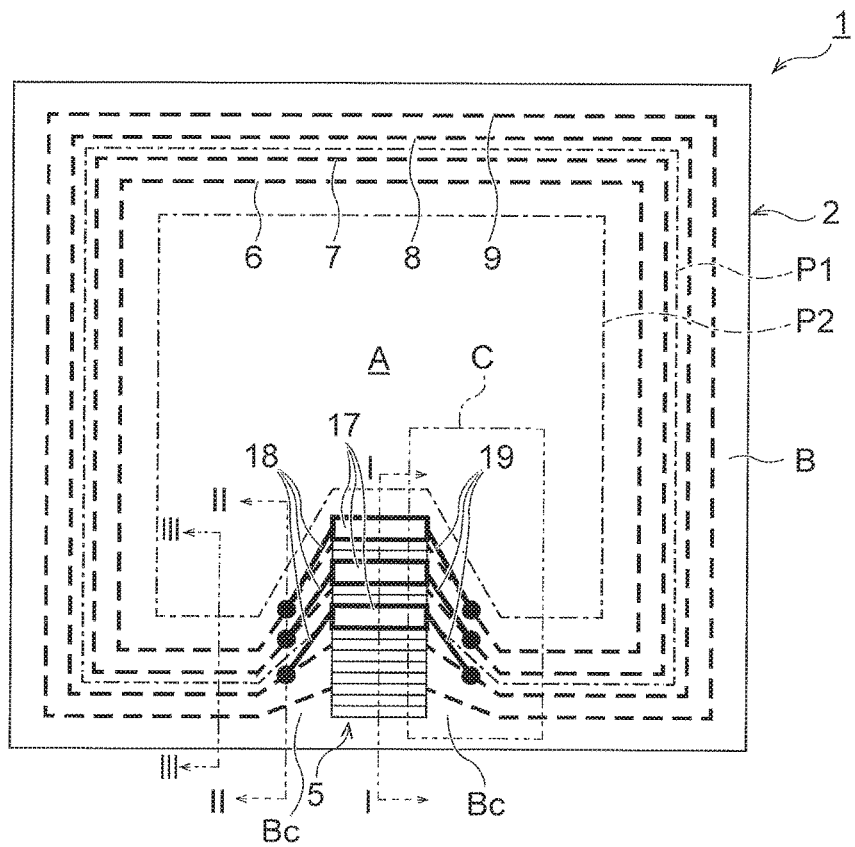
FIG. 1 is a plan view of a semiconductor device 1 (IGBT) according to a first embodiment.

Semiconductor devices according to embodiments of the present invention are described with reference to the drawings. In each diagram, configuration elements having analogous functions are assigned the same signs.

First Embodiment

Referring to FIGS. 1 to 5 and 10, a semiconductor device 1 according to a first embodiment of the present invention is described. A plan view of a semiconductor device 1 shown in FIG. 1 does not illustrate an insulating film 15, a surface protecting film 16, an emitter electrode 21, a gate electrode 22, and a stopper electrode 24. A sectional view of FIG. 3A does not strictly correspond to a partially enlarged view of FIG. 10.

The semiconductor device 1 according to the first embodiment is IGBT having a MOS structure. Principal current flows between an upper surface 2a (one principal surface) and a lower surface 2b (the other principal surface) of a conductive semiconductor substrate 2. The semiconductor substrate 2 is a silicon substrate in this embodiment. The present invention is not limited thereto. Another semiconductor substrate (e.g., SiC substrate, GaN substrate, etc.) may be adopted. The conductive type of the semiconductor substrate 2 is an n-type in this embodiment. However, the type is not limited thereto.

As shown in FIG. 1, an active region A where principal current flows, and a voltage supporting region B that surrounds the active region A are disposed on the upper surface 2a of the semiconductor substrate 2. The voltage supporting region B includes a peripheral portion of the semiconductor substrate 2. Here, "peripheral portion" is a peripheral part of the semiconductor substrate 2 that includes the side surfaces of the semiconductor substrate 2.

As shown in FIGS. 1 to 3A and 3B, the semiconductor device 1 includes: a p-type diffusion layer 3; an insulating film 4 (first insulating film); an insulating film 15 (second insulating film); an overvoltage protection diode 5; conductor portions 6, 7, 8 and 9; an n-type buffer region 11; a p-type collector region 12; an n-type diffusion region 13; an n-type stopper region 14; a surface protecting film 16; an emitter electrode 21; a gate electrode 22; a collector electrode 23; and a stopper electrode 24. A gate pad (not shown) is provided on the upper surface 2a of the semiconductor substrate 2.

The diffusion layer 3 is selectively formed on the upper surface 2a of the voltage supporting region B, and surrounds the active region A. The diffusion layer 3 is also called a p-type base region. A region surrounded by boundaries P1 and P2 in FIG. 1 is the p-type base region. Here, the boundary P1 is the boundary of a p-n junction between the diffusion layer 3 and the peripheral semiconductor region 10. The boundary P2 is the boundary between the active region A and the voltage supporting region B. The peripheral semiconductor region 10 is an n-type semiconductor region disposed outside of the diffusion layer 3.

The semiconductor device 1 may further include a p-type diffusion layer (guard ring) provided so as to surround the diffusion layer 3 in order to achieve high breakdown voltage. The guard ring is selectively formed on the upper surface 2a of the voltage supporting region B. The number of guard rings is not limited to one. The number may be two or more instead.

The impurity concentrations of the diffusion layer 3 and the guard ring are, for example, $1 \times 10^{14}$ cm$^{-3}$ to $1 \times 10^{19}$ cm$^{-3}$. The depths of the diffusion layer 3 and the guard ring are, for example, 2 μm to 10 μm. The impurity concentration of the peripheral semiconductor region 10 is, for example, $1 \times 10^{13}$ cm$^{-3}$ to $1 \times 10^{15}$ cm$^{-3}$.

Figure 2:
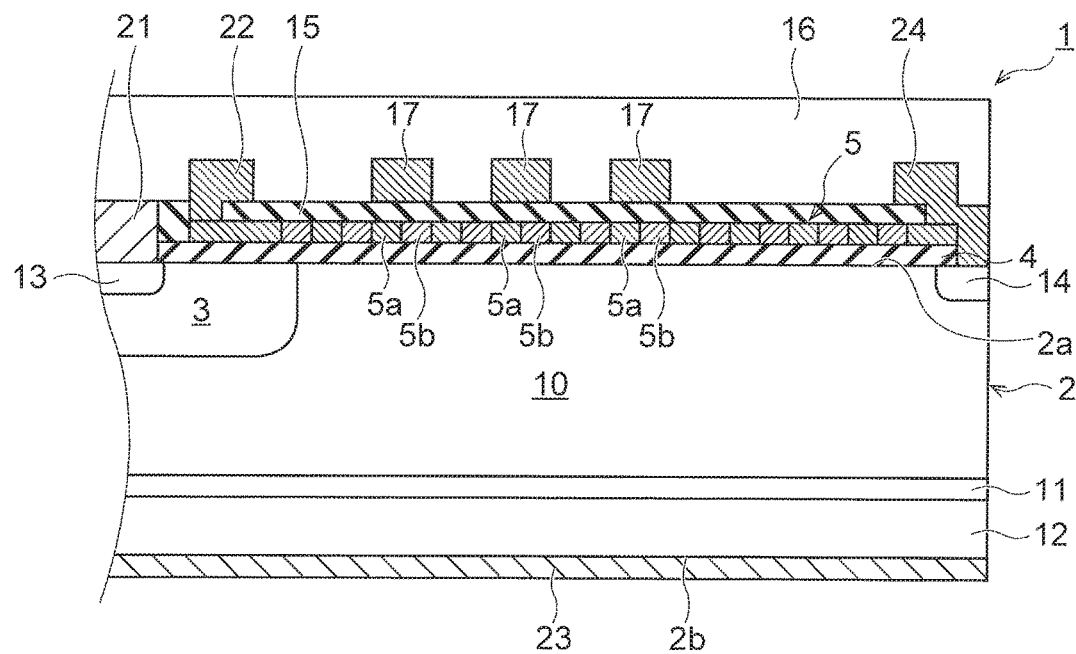
FIG. 2 is a sectional view taken along line I-I of FIG. 1.

The insulating film 4 is formed on the voltage supporting region B of the semiconductor substrate 2. In this embodiment, as shown in FIG. 2, the insulating film 4 is formed on the diffusion layer 3 and the peripheral semiconductor region 10. The insulating film 4 is, for example, silicon dioxide film ($SiO_2$) and, more specifically, field oxide film. The thickness of the insulating film 4 is, for example, 200 nm to 2000 nm.

The overvoltage protection diode 5 is made up of multiple Zener diodes connected in series. In this embodiment, the overvoltage protection diode 5 is an overvoltage protection diode provided between the collector electrode 23 and the gate electrode 22 of the semiconductor device 1. The configuration of the overvoltage protection diode according to the present invention may be applied to the overvoltage protection diode provided between the gate electrode 22 and the emitter electrode 21.

Figure 4:
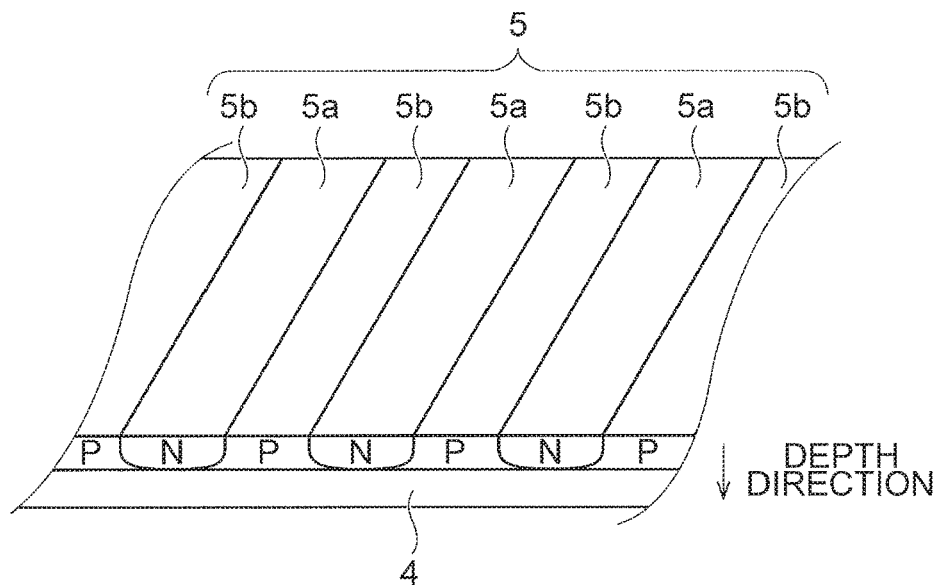
FIG. 4 is a partially enlarged perspective view of an overvoltage protection diode 5.

As shown in FIGS. 2 and 4, the overvoltage protection diode 5 includes n-type semiconductor layers 5a and p-type semiconductor layers 5b that are alternately arranged on the insulating film 4 in a manner adjacent to each other. That is, the overvoltage protection diode 5 is formed on the insulating film 4, and is configured by alternately arranging the n-type semiconductor layers 5a and the p-type semiconductor layers 5b in a manner adjacent to each other. The n-type semiconductor layers 5a and the p-type semiconductor layers 5b are formed on the insulating film 4 of the voltage supporting region B. For example, the overvoltage protection diode 5 is formed by forming p-type semiconductor layers on the insulating film 4 and subsequently introducing n-type impurities to predetermined regions in the p-type semiconductor layers.

The n-type semiconductor layers 5a and the p-type semiconductor layers 5b are made of conductive semiconductor (polysilicon to which impurities are introduced in this embodiment). More specifically, the n-type semiconductor layers 5a are polysilicon layers to which n-type impurities (phosphorus etc.) are introduced. The p-type semiconductor layers 5b are polysilicon layers to which p-type impurities (boron etc.) are introduced. The impurity concentration of the p-type semiconductor layer 5b is, for example, $1 \times 10^{16}$ cm$^{-3}$ to $1 \times 10^{18}$ cm$^{-3}$. The impurity concentration of the n-type semiconductor layer 5a is, for example, $1 \times 10^{19}$ cm$^{-3}$ to $1 \times 10^{21}$ cm$^{-3}$. Thus, the concentration of the p-type impurities in the p-type semiconductor layer 5b is lower than the concentration of the n-type impurities in the n-type semiconductor layer 5a. The thickness of the polysilicon layer is, for example, 100 nm to 1000 nm.

As shown in FIG. 1, the conductor portions 6, 7, 8 and 9 are formed on the insulating film 4 so as to surround the active region A along the voltage supporting region B, and are electrically connected to respective predetermined sites on the overvoltage protection diode 5. That is, the conductor portions 6, 7, 8 and 9 are electrically connected to the semiconductor layer (n-type semiconductor layers 5a or p-type semiconductor layers 5b) of the overvoltage protection diode 5 on the basis of respective required voltages. The semiconductor layer that is the connection destination is a semiconductor layer having the same conductive type as the conductor portions have. The conductor portions may be connected across two or more semiconductor layers.

Figure 3A:
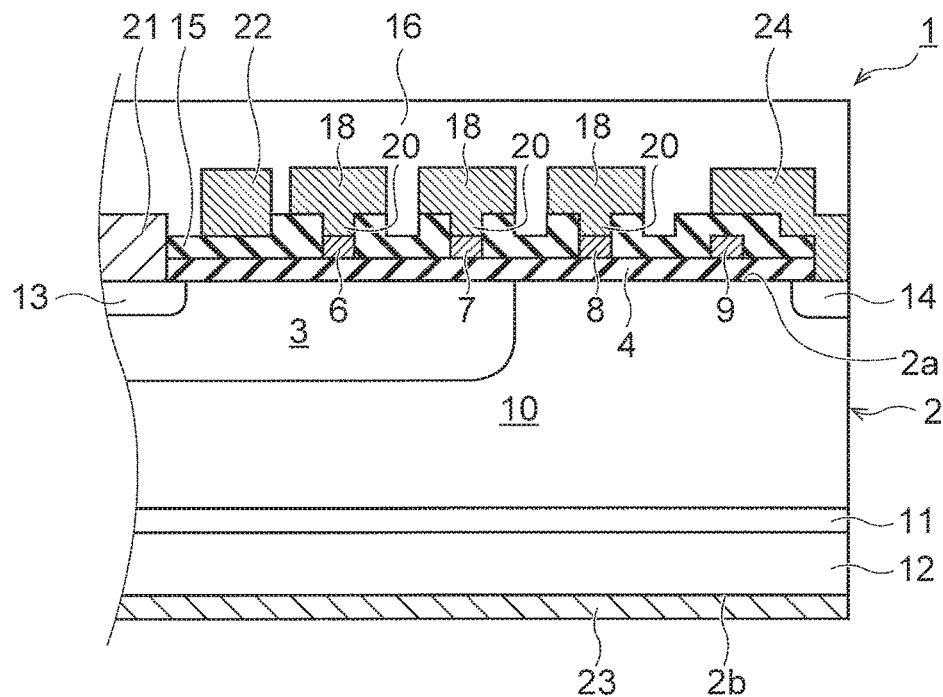
FIG. 3A is a sectional view taken along line II-II of FIG. 1.
Figure 3B:
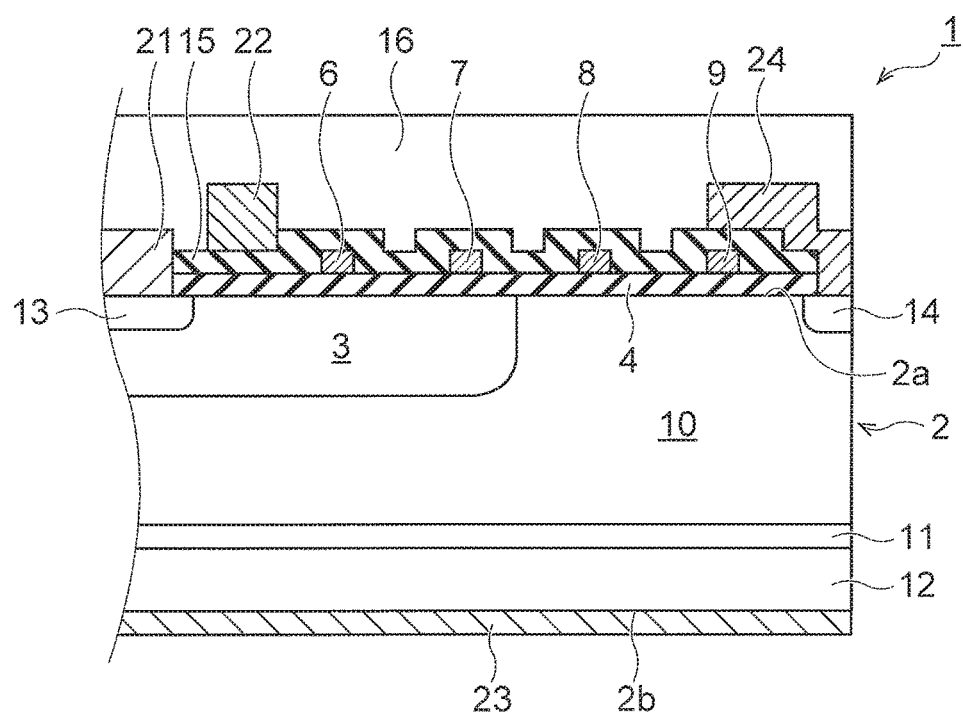
FIG. 3B is a sectional view taken along line III-III of FIG. 1.

The conductor portions 6, 7, 8 and 9 are made of, for example, polysilicon to which impurities are introduced, or conductive material, such as aluminum. In this embodiment, as shown in FIGS. 3A and 3B, the conductor portions 6 and 7 are arranged above the diffusion layer 3 with the insulating film 4 intervening therebetween. The conductor portions 8 and 9 are arranged above the peripheral semiconductor region 10 with the insulating film 4 intervening therebetween. The number of conductor portions is not limited to four. Any number of conductor portions may be adopted.

As shown in FIG. 2, the diffusion region 13 is an n-type semiconductor region formed in the diffusion layer 3. The emitter electrode 21 is formed on the diffusion region 13. The impurity concentration of the diffusion region 13 is, for example, $1\times10^{19}$ cm$^{-3}$ to $1\times10^{21}$ cm$^{-3}$.

As shown in FIGS. 2 and 3A, the stopper region 14 is an n-type semiconductor region formed on the upper surface 2a at a side end of the semiconductor substrate 2. The impurity concentration of the stopper region 14 is higher than that of the peripheral semiconductor region 10. The stopper electrode 24 is electrically connected to the other end (right end in FIG. 2) of the overvoltage protection diode 5. The stopper electrode 24 is formed on the stopper region 14. The impurity concentration of the stopper region 14 is, for example, $1\times10^{19}$ cm$^{-3}$ to $1\times10^{21}$ cm$^{-3}$.

The gate electrode 22 is provided above the diffusion layer 3 with the insulating film 4 intervening therebetween. In this embodiment, the gate electrode 22 is formed on the overvoltage protection diode 5. More specifically, as shown in FIG. 2, the gate electrode 22 is electrically connected to one end (left end in FIG. 2) on the active region A side of the overvoltage protection diode 5.

The p-type collector region 12 is formed on the lower surface 2b of the semiconductor substrate 2. The impurity concentration of the collector region 12 is, for example, $1\times10^{17}$ cm$^{-3}$ to $1\times10^{19}$ cm$^{-3}$. As shown in FIG. 2, the collector electrode 23 is formed on the collector region 12. The n-type buffer region 11 is provided adjacent to the collector region 12. The impurity concentration of the buffer region 11 is, for example, $1\times10^{16}$ cm$^{-3}$ to $1\times10^{18}$ cm$^{-3}$.

As shown in FIG. 2, the insulating film 15 is provided so as to cover the overvoltage protection diode 5 and the conductor portions 6, 7, 8 and 9. The thickness of the insulating film 15 is, for example, 200 nm to 2000 nm. The insulating film 15 is, for example, silicon dioxide film, and is BPSG (Boron Phosphorous Silicate Glass) in this embodiment.

As shown in FIG. 2, the surface protecting film 16 covers the entire upper surface 2a side of the semiconductor device 1. The surface protecting film 16 is, for example, polyimide film or silicon nitride film.

High-potential portions 17 are provided above the overvoltage protection diode 5 with the insulating film 15 intervening therebetween. That is, the high-potential portions 17 are formed directly on the p-type semiconductor layers 5b. In this embodiment, the high-potential portions 17 are formed on the insulating film 15 as shown in FIG. 2. As shown in FIG. 2, multiple p-type semiconductor layers 5b may be provided immediately under the high-potential portions 17. The high-potential portions 17 electrically connected to the outermost conductor portion 9 may be provided above the overvoltage protection diode 5. More generally, the high-potential portions 17 may be provided for at least freely selected one of the conductor portions 6, 7, 8 and 9.

The high-potential portions 17 are made of a conductive material (e.g., metal, such as aluminum). The high-potential portions 17 are formed in the same step as that for the emitter electrode 21 and the gate electrode 22, for example.

The high-potential portions 17 are electrically connected to the conductor portions 6, 7 or 8 via conductive connectors 18 (first conductive connector) and conductive connectors 19 (second conductive connector). More specifically, the high-potential portion 17 has one end (e.g., left end) electrically connected to the conductor portions 6, 7 or 8 via the conductive connector 18, and the other end (e.g., right end) electrically connected to the conductor portions 6, 7 or 8 via the conductive connector 19.

The semiconductor device 1 may further include an upper conductor portion made of conductive material formed on the insulating film 15. For example, the upper conductor portion is provided so as to be overlapped in a plan view with the conductor portion 6, and is electrically connected to the high-potential portions 17 via the conductive connectors 18 and 19. For example, in a case where the conductor portion 6 has a ring shape as shown in FIG. 1, the upper conductor portion is formed to have a ring shape in conformity with the conductor portion 6. Such an upper conductor portion is thus provided, which can further stabilize the surface potential of the voltage supporting region B, and further improve the reliability of the semiconductor device 1.

As shown in FIG. 3A, the conductive connectors 18 (19) are formed on the insulating film 15. The conductive connector 18 (19) have one end electrically connected to the high-potential portions 17, and the other end electrically connected to the conductor portions 6, 7 or 8. As shown in FIG. 3A, the other ends of the conductive connectors 18 and 19 are electrically connected to the conductor portions 6, 7 or 8 via contact layers 20 provided through the insulating film 15. The contact layers 20 can be integrally formed with the conductive connectors 18 and 19. For example, the conductive connectors 18 and 19 and contact layers 20 are formed together in a step of forming the high-potential portions 17.

The contact layers 20 are provided in a connecting region Bc in this embodiment. Here, as shown in FIG. 1, the connecting region Bc is a region in proximity to the overvoltage protection diode 5, and is a region where the conductor portions 6, 7, 8 and 9 are configured to have a large width so as to be connected to the overvoltage protection diode 5.

The contact layers 20 may be provided in a region out of the connecting region Bc. Any of the conductive connectors 18 and 19 may be omitted. That is, the high-potential portions 17 may be electrically connected to the conductor portions 6, 7 or 8 via the conductive connectors 18 and 19.

Figure 9:
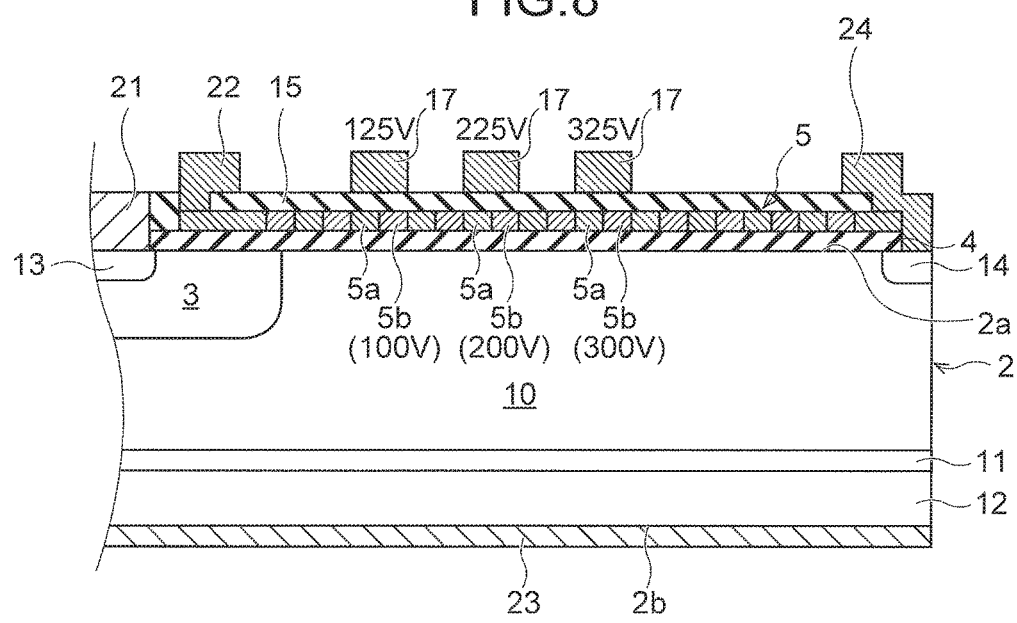
FIG. 9 is a diagram showing one example of the potential of each region in a reverse bias application state.
Figure 10:
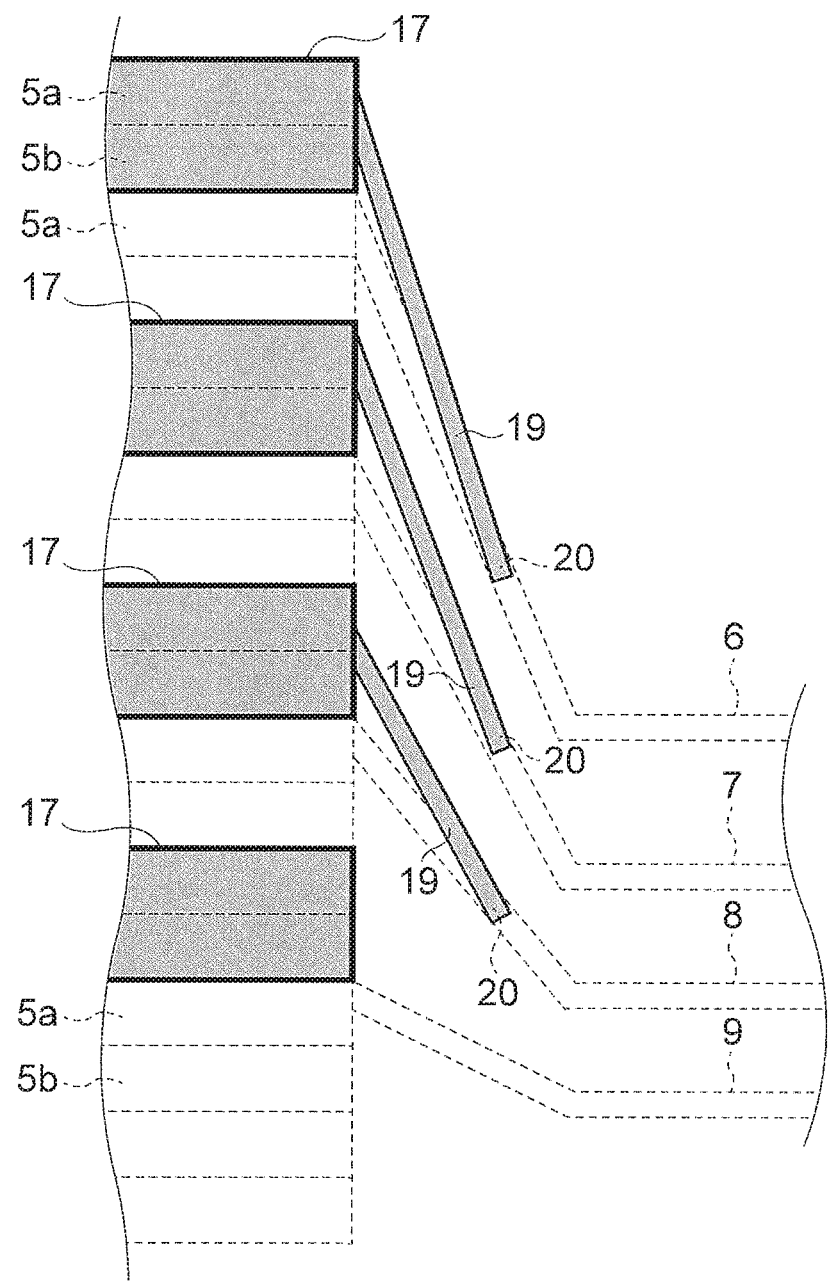
FIG. 10 is an enlarged plan view of a region C of FIG. 1.

As shown in FIGS. 1 and 10, the high-potential portions 17 are arranged above the overvoltage protection diode 5 at sites on the center side (i.e., low voltage side) with respect to the sites where the conductor portions 6, 7 or 8 to which the conductive connectors 18 and 19 are connected is connected to the overvoltage protection diode 5. Thus, as shown in FIG. 9, the high-potential portions 17 have a higher potential than a potential of the p-type semiconductor layers 5b disposed immediately therebelow in a reverse bias application state. Here, in the first embodiment, the reverse bias application state is a state where the collector electrode 23 is connected to a high potential (e.g., a positive pole of a direct-current power source), the emitter electrode 21 is grounded, and a low voltage to an extent that does not turn on IGBT is applied to the gate electrode 22.

Thus, as shown in FIG. 9, the high-potential portions 17 have a higher potential than a potential of the p-type semiconductor layers 5b disposed immediately therebelow in the reverse bias application state.

As described above, the semiconductor device 1 according to this embodiment includes the high-potential portions 17. Consequently, in the reverse bias application state, positive charges (positive holes, mobile ions, etc.) in the p-type semiconductor layer 5b are away from the boundary between the p-type semiconductor layer 5b and the insulating film 15. That is, the positive charges in the p-type semiconductor layer move into the inner region of the p-type semiconductor layer.

Figure 5:
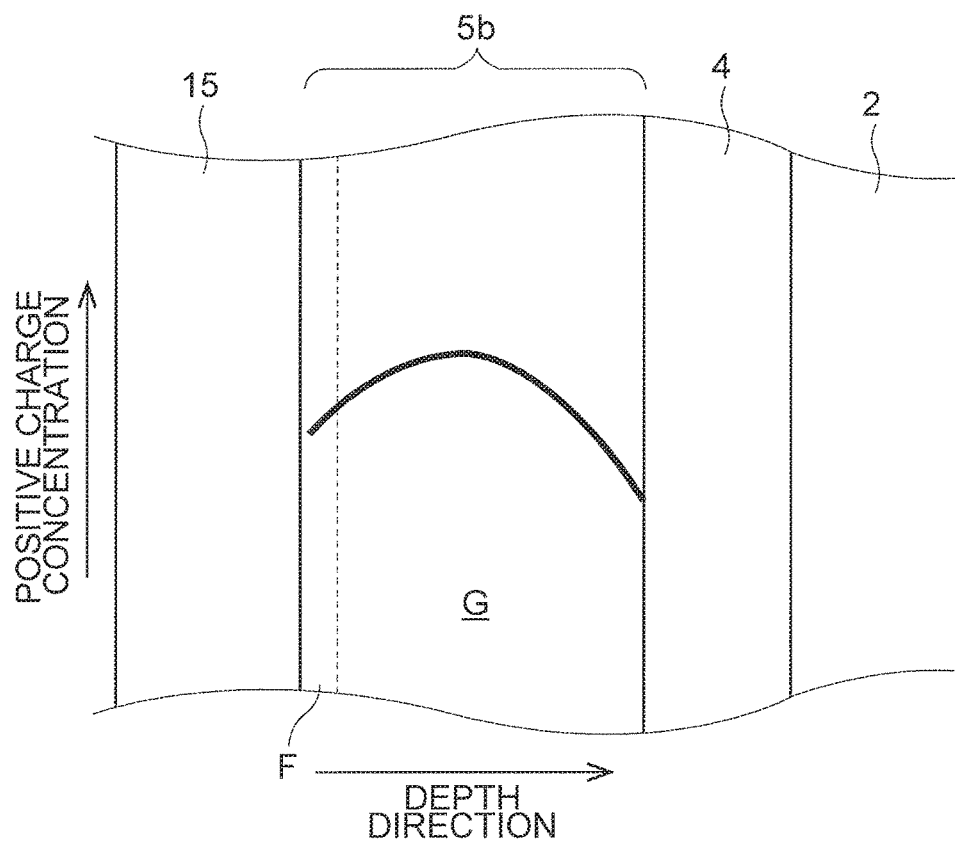
FIG. 5 is a diagram showing a profile of positive charge concentration of a p-type semiconductor layer 5b in a reverse bias application state.

As a result, as shown in FIG. 5, the concentration of positive charges in the boundary region F is lower than the concentration of positive charges in the inner region G. That is, the concentration peak of positive charges is in the inner region G in the p-type semiconductor layer 5b. Consequently, the overvoltage protection diode 5 causes Zener breakdown in the inner region G.

Here, the "boundary region F" is a region in the p-type semiconductor layer 5b, and is a region that includes the boundary between the p-type semiconductor layer 5b and the insulating film 15. That is, the boundary region F is the boundary region between the p-type semiconductor layer 5b and the insulating film 15.

The overvoltage protection diode 5 thus causes Zener breakdown in the inner region G. Consequently, even when mobile ions such as sodium or impurities such as boron move across the boundary region F and the p-type semiconductor layer 5b, variation in the breakdown voltage of the overvoltage protection diode 5 can be reduced. This embodiment can therefore reduce variation in the breakdown voltage of an overvoltage protection diode 5. That is, the breakdown voltage of the overvoltage protection diode 5 can be stabilized.

<Variational Example of Semiconductor Device 1>

Figure 6:
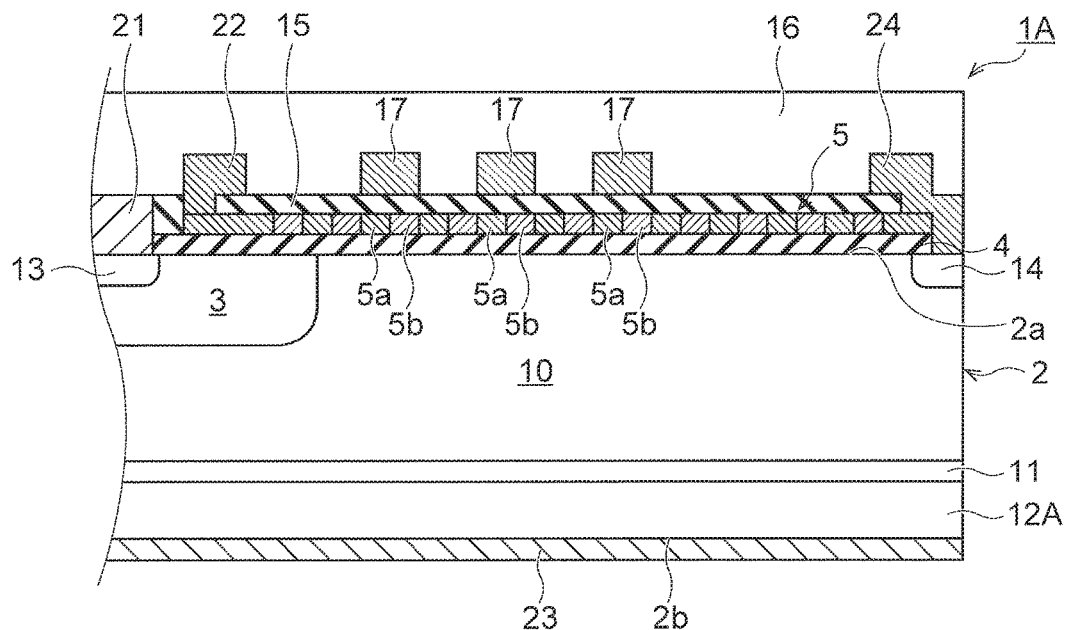
FIG. 6 is a sectional view of a semiconductor device 1A according to a modification of the first embodiment.

The configuration of IGBT is not limited to that of the semiconductor device 1. FIG. 6 is a sectional view of a semiconductor device 1A according to a modification of the first embodiment. In FIG. 6, the same configuration elements as those in FIG. 2 are assigned the same signs.

As shown in FIG. 6, the semiconductor device 1A according to the modification includes: an n-type drain region 12A instead of the p-type collector region 12; and a collector electrode 23 that forms Schottky barrier together with the drain region 12A. In this case, the collector electrode 23 includes barrier metal made of platinum, molybdenum, etc.

Also in the semiconductor device 1A, the high-potential portions 17 are formed on the insulating film 15. The high-potential portions 17 move positive charges in the p-type semiconductor layer 5b downward (toward the collector electrode 23) in the reverse bias application state, thereby allowing variation in the breakdown voltage of the overvoltage protection diode 5 to be reduced.

Second Embodiment

Figure 7:
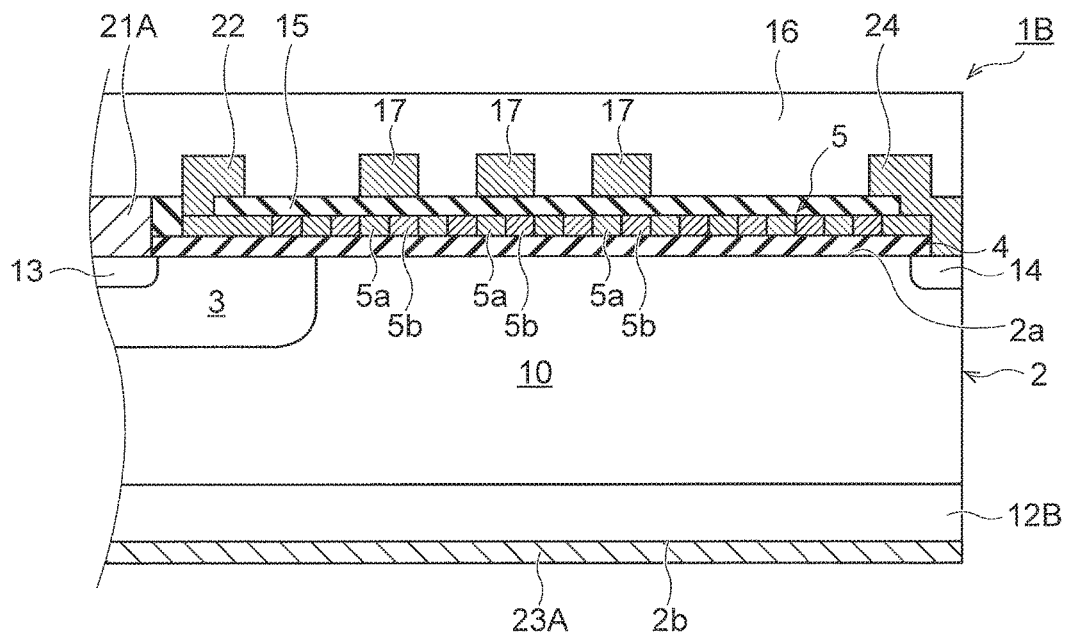
FIG. 7 is a sectional view of a semiconductor device 1B (vertical MOSFET) according to a second embodiment.
Figure 8:
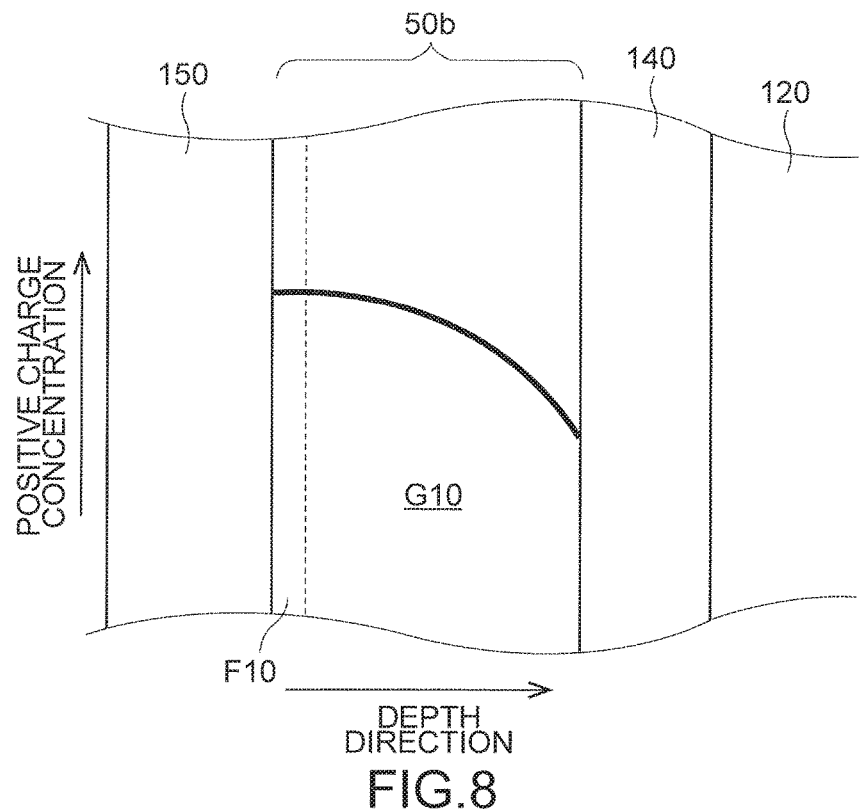
FIG. 8 is a diagram showing a profile of positive charge concentration of a conventional p-type semiconductor layer 50b.

Next, a semiconductor device 1B according to a second embodiment of the present invention is described. The semiconductor device 1B is a vertical MOSFET. The plan view of the semiconductor device 1B is analogous to that of FIG. 1. FIG. 7 is a sectional view of the semiconductor device 1B, and corresponds to FIG. 2 described in the first embodiment. In FIG. 7, the same configuration elements as those in the first embodiment are assigned the same signs. Description is hereinafter made mainly on differences from the first embodiment.

The semiconductor device 1B includes: a p-type diffusion layer 3; an insulating film 4; an overvoltage protection diode 5; conductor portions 6, 7, 8 and 9; an n-type drain region 12B; an n-type diffusion region 13; an n-type stopper region 14; high-potential portions 17; conductive connectors 18 and 19; contact layers 20; a source electrode 21A; a gate electrode 22; a drain electrode 23A; and a stopper electrode 24. The drain region 12B is formed on the lower surface 2b of the semiconductor substrate 2. The drain electrode 23A is formed on the drain region 12B. The source electrode 21A is formed on the diffusion region 13.

The overvoltage protection diode 5 is an overvoltage protection diode provided between the drain electrode 23A, which is a vertical MOSFET, and the gate electrode 22, or the source electrode 21A and the gate electrode 22.

Also in the semiconductor device 1B, the high-potential portions 17 are formed on the insulating film 15. The high-potential portions 17 move positive charges in the p-type semiconductor layer 5b downward (toward the collector electrode 23) in the reverse bias application state, thereby allowing variation in the breakdown voltage of the overvoltage protection diode 5 to be reduced. Consequently, according to the second embodiment, an MOSFET that can reduce the variation in the breakdown voltage of the overvoltage protection diode 5 can be provided.

Based on the above description, those skilled in the art may imagine additional advantageous effects of the present invention and various modifications. However, the modes of the present invention are not limited to the individual embodiments described above. Configuration elements in different embodiments may be appropriately combined. Various types of addition, modification and partial deletion can be made within a range without departing from the conceptual thought and spirit of the present invention that can be derived from the content specified in the claims and equivalents thereof.

REFERENCE SIGNS LIST 1, 1A, 1B semiconductor device
2 semiconductor substrate
2a upper surface
2b lower surface
3 diffusion layer
4, 140 insulating film
5 overvoltage protection diode
5a n-type semiconductor layer
5b, 50b p-type semiconductor layer
6, 7, 8, 9 conductor portion
10 peripheral semiconductor region
11 buffer region
12 collector region
12A, 12B drain region
13 diffusion region
14 stopper region
15, 150 insulating film
16 surface protecting film
17 high-potential portion
18, 19 conductive connector
20 contact layer
21 emitter electrode 21A source electrode
22 gate electrode
23 collector electrode
23A drain electrode
24 stopper electrode
A active region
B voltage supporting region
C region
F, F10 boundary region
G, G10 inner region
P1, P2 boundary (of diffusion layer 3)

The invention claimed is:

1. A semiconductor device with principal current flowing from one principal surface to another principal surface of a semiconductor substrate,
   wherein the one principal surface of the semiconductor substrate includes an active region, and a voltage supporting region that surrounds the active region and contains a peripheral portion of the semiconductor substrate, and
   the semiconductor device comprises:
      a first insulating film formed on the voltage supporting region;
      an overvoltage protection diode that includes an n-type semiconductor layer and a p-type semiconductor layer that are alternately arranged on the first insulating film in a manner adjacent to each other;
      a gate electrode formed on the overvoltage protection diode;
      a stopper region formed on the one principal surface at a side end of the semiconductor substrate;
      a stopper electrode formed on the stopper region and electrically connected to one end of the overvoltage protection diode;
      a plurality of conductor portions that are formed on the first insulating film, and are electrically connected to the overvoltage protection diode;
      a second insulating film that covers the overvoltage protection diode and the conductor portions; and
      a high-potential portion provided above the overvoltage protection diode with the second insulating film intervening therebetween, the high-potential portion being provided between the gate electrode and the stopper electrode,
   a p-type impurity concentration of the p-type semiconductor layer is lower than an n-type impurity concentration of the n-type semiconductor layer, and
   the high-potential portion has a higher potential than a potential of the p-type semiconductor layer disposed immediately under the high-potential portion in an inversely biased application state,
   wherein the high-potential portion is electrically connected to a first conductor portion of the conductor portions via a conductive connector formed on the second insulating film,
   wherein the conductive connector has one end electrically connected to the high-potential portion, and another end electrically connected to the first conductor portion.

2. The semiconductor device according to claim 1, wherein in the inversely biased application state, a concentration of positive charges of the p-type semiconductor layer in a boundary region of the p-type semiconductor layer with the second insulating film is lower than a concentration of positive charges in a region inner than the boundary region of the p-type semiconductor layer.

3. The semiconductor device according to claim 1, wherein the high-potential portion is formed on the second insulating film.

4. The semiconductor device according to claim 1, further comprising a plurality of the p-type semiconductor layers immediately under the high-potential portion.

5. The semiconductor device according to claim 1, wherein the high-potential portion is disposed above the overvoltage protection diode at a site nearer to a center than a site where the first conductor portion is connected to the overvoltage protection diode.

6. The semiconductor device according to claim 1, wherein the other end of the conductive connector is electrically connected to the first conductor portion via a contact layer provided through the second insulating film.

7. The semiconductor device according to claim 6, wherein the contact layer is provided in a connecting region that allows the first conductor portions to be connected to the overvoltage protection diode.

8. The semiconductor device according to claim 1, wherein the conductive connector is disposed nearer in a plan view to the active region than the first conductor portions electrically connected to the conductive connector.

9. The semiconductor device according to claim 1, wherein the conductive connector has a first conductive connector for electrically connecting one end of the high-potential portion and the first conductor portion and a second conductive connector for electrically connecting another end of the high-potential portion and the first conductor portion.

10. The semiconductor device according to claim 1, further comprising an upper conductor portion that is made of conductive material formed on the second insulating film, is electrically connected to the high-potential portion, and is arranged so as to be overlapped in a plan view with the first conductor portions.

11. The semiconductor device according to claim 1, wherein the p-type semiconductor layer and the n-type semiconductor layer are made of polysilicon.

12. The semiconductor device according to claim 1, wherein the first insulating film and/or the second insulating film are made of silicon dioxide film.

13. The semiconductor device according to claim 1,
   wherein the semiconductor substrate is of a first conductive type,
   the semiconductor device further comprises:
      a second conductive type diffusion layer that is selectively formed on one principal surface in the voltage supporting region, and surrounds the active region;
      a first conductive type diffusion region formed in the diffusion layer;
      an emitter electrode formed on the diffusion region;
      a second conductive type collector region formed on another principal surface of the semiconductor substrate; and
      a collector electrode formed on the collector region.

14. The semiconductor device according to claim 1,
   wherein the semiconductor substrate is of a first conductive type,
   the semiconductor device further comprises:
      a second conductive type diffusion layer that is selectively formed on one principal surface in the voltage supporting region, and surrounds the active region;
      a first conductive type diffusion region formed in the diffusion layer;
      an emitter electrode formed on the diffusion region;
      a first conductive type drain region formed on another principal surface of the semiconductor substrate; and a collector electrode that is formed on the drain region, and forms a Schottky barrier together with the drain region.

15. The semiconductor device according to claim 1,
wherein the semiconductor substrate is of a first conductive type, and
the semiconductor device further comprises:
- a second conductive type diffusion layer that is selectively formed on one principal surface in the voltage supporting region, and surrounds the active region;
- a first conductive type diffusion region formed in the diffusion layer;
- a source electrode formed on the diffusion region;
- a first conductive type drain region formed on another principal surface of the semiconductor substrate; and
- a drain electrode formed on the drain region.

* * * * *